United States Patent
Kawaguchi et al.

(10) Patent No.: US 9,161,486 B2
(45) Date of Patent: Oct. 13, 2015

(54) ELECTRONIC PARTS MOUNTING APPARATUS AND ELECTRONIC PARTS MOUNTING METHOD

(75) Inventors: Teppei Kawaguchi, Yamanashi (JP); Michiaki Mawatari, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 210 days.

(21) Appl. No.: 13/820,870

(22) PCT Filed: Aug. 23, 2011

(86) PCT No.: PCT/JP2011/004674
§ 371 (c)(1), (2), (4) Date: Mar. 5, 2013

(87) PCT Pub. No.: WO2012/035703
PCT Pub. Date: Mar. 22, 2012

(65) Prior Publication Data
US 2013/0160282 A1    Jun. 27, 2013

(30) Foreign Application Priority Data
Sep. 14, 2010 (JP) ................. 2010-205120

(51) Int. Cl.
*H05K 3/30* (2006.01)
*B23P 19/00* (2006.01)
*H01S 4/00* (2006.01)
(Continued)

(52) U.S. Cl.
CPC .............. *H05K 13/04* (2013.01); *H05K 13/021* (2013.01); *H05K 13/0417* (2013.01); *Y10T 29/49002* (2015.01)

(58) Field of Classification Search
CPC ................... H01G 7/023; H01L 2924/01079; H01R 43/205
USPC .......................... 29/592.1, 832, 739
See application file for complete search history.

(56) References Cited

U.S. PATENT DOCUMENTS 5,153,983 A * 10/1992 Oyama ........................... 29/740
5,456,001 A * 10/1995 Mori et al. ...................... 29/739
(Continued)

FOREIGN PATENT DOCUMENTS

JP    09-252196    *   9/1997
JP    09-252196 A      9/1997
(Continued)

OTHER PUBLICATIONS

International Search Report for PCT/JP2011/004674 dated Oct. 11, 2011.

*Primary Examiner* — David Angwin
(74) *Attorney, Agent, or Firm* — Pearne & Gordon LLP

(57) ABSTRACT

It is an objective to provide an electronic parts mounting apparatus and an electronic parts mounting method for making it possible to mount various types of electronic parts having equivalent electric characteristics on a single substrate. Before a mount head 15 starts mounting LED parts 4 on substrates 3 positioned by substrate conveyance paths 12, the number of LED parts 4 still remaining on a plurality of tape feeders 13 is compared, according to the type of the LED part 4, with target number of LED parts 4 to be mounted on the substrates 3. When the number of remaining LED parts 4 of at least one type becomes smaller than the target number of LED parts 4 to be mounted, the mount head 15 is deactivated.

1 Claim, 4 Drawing Sheets

(51) Int. Cl.
*H05K 13/04* (2006.01)
*H05K 13/02* (2006.01)

(56) References Cited

U.S. PATENT DOCUMENTS

| | | | |
|---|---|---|---|
| 5,740,604 A * | 4/1998 | Kitamura et al. | 29/832 |
| 6,971,161 B1 * | 12/2005 | Maenishi et al. | 29/832 |
| 7,356,919 B2 * | 4/2008 | Hata et al. | 29/833 |
| 2002/0133940 A1 * | 9/2002 | Kadomatsu et al. | 29/832 |
| 2003/0024112 A1 * | 2/2003 | Mimura et al. | 29/832 |
| 2004/0237297 A1 * | 12/2004 | Hata et al. | 29/832 |
| 2013/0129467 A1 * | 5/2013 | Kawaguchi et al. | 414/806 |
| 2014/0090244 A1 * | 4/2014 | Sakamoto | 29/832 |

FOREIGN PATENT DOCUMENTS

| | | |
|---|---|---|
| JP | 2004-063940 A | 2/2004 |
| JP | 2008-103418 A | 5/2008 |
| JP | 2011-165946 A | 8/2011 |

\* cited by examiner

ELECTRONIC PARTS MOUNTING APPARATUS AND ELECTRONIC PARTS MOUNTING METHOD

TECHNICAL FIELD

The invention relates to an electronic parts mounting apparatus and an electronic parts mounting method for picking up a plurality of types of electronic parts fed from a plurality of parts feeders with a mount head and mounting the thus-picked-up parts on a substrate.

BACKGROUND ART

An electronic parts mounting apparatus is made up of substrate conveyance paths that convey and position a substrate on which electronic parts are to be mounted, parts feeders that feed electronic parts to be mounted on a substrate, a mount head that picks up the electronic parts fed by the parts feeders and that mounts the electronic parts on the substrate positioned by the substrate conveyance paths. The parts feeder feeds an electronic part housed in a parts storage to be removably attached (i.e., a tape when the parts feeder is a tape feeder, or a cassette when the parts feeder is a bulk feeder), and the mount head picks up the thus-fed electronic part and mount it on the substrate. From an aspect of making it possible to manage quality of electronic parts to be mounted on the substrate on a per-parts-storage basis, electronic parts having equivalent electronic characteristics are stored in the same parts storage.

When electronic parts in the parts storage run out as a result of proceeding of electronic parts feeding, the parts feeder comes into so-called parts shortage and waits for replacement of the parts storage. With a view toward eliminating such a time loss due to such a wait for replacement of the parts storage, the mount head picks up an electronic part from another parts feeder that is different from the parts feeder depleted of parts (in other words, a parts feeder from which electronic parts are to be picked up is changed), thereby continuing mounting electronic parts on substrates (see; for instance, Patent Document 1).

RELATED ART DOCUMENT

Patent Document

Patent Document 1: JP-A-2004-63940

SUMMARY OF THE INVENTION

Problem that the Invention is to Solve

However, mounting electronic parts on substrates is continually performed by replacement of a parts feeder when the parts feeder has run out of parts as mentioned above. In this apparatus, a parts storage is changed before or after replacement of the parts feeder, so that an electric characteristic of the electronic parts changes. For this reason, if the parts feeder is replaced in the course of the mount head mounting electronic parts on one substrate, electronic parts having different electric characteristics will be mixedly mounted in a single substrate. For this reason, the technique for continually mounting electronic parts by replacing a parts feeder when parts have run out is very effective for production of substrates that tolerate certain degrees of variations in electronic characteristic of electronic parts to be mounted. However, in the case of a substrate, like a lighting substrate such as a liquid crystal panel, in which variations in electric characteristic of electronic parts to be mounted (LED parts) might greatly affect product quality (uniformity of lighting distribution) and make quality of an entire substrate defective, the technique will pose, if anything, a problem of inconvenience.

In the case of, in particular, manufacture of the lighting substrate on which a plurality of types (colors) of LED parts are to be mounted, there are many occasions where a parts feeder is replaced in the middle of mounting electronic parts (LED parts) on a single substrate. For this reason, mixed mounting of electronic parts having different electrical characteristics is likely to occur. In addition, since the number of electronic parts to be mounted on a single substrate is also large, a loss, which would be incurred as a result of the substrate becoming poor in quality and disposed of, will become enormous.

Accordingly, the invention aims at providing an electronic parts mounting apparatus and an electronic parts mounting method for mounting various types of electronic parts having equivalent electrical characteristics on a single substrate.

Means for Solving the Problem

In one aspect of the invention, an electronic parts mounting apparatus is equipped with a substrate conveyance path for conveying and positioning a substrate on which a plurality of types of electronic parts are to be mounted; a plurality of parts feeders that feed according to the type the plurality of types of electronic parts to be mounted on the substrate; a mount head that picks up the plurality of types of electronic parts fed from the respective parts feeders and mounts the thus-picked-up electronic parts to the substrate positioned by the substrate conveyance paths; a remaining parts number calculation unit that calculates number of electronic parts still remaining on the plurality of parts feeders according to the type of the electronic part; target parts-to-be-mounted number memory unit that stores target number of electronic parts to be mounted on the substrate according to the type of the electronic part; and mount head deactivation unit that, before the mount head starts mounting the electronic parts on the substrate positioned by the substrate conveyance path, compares according to the type of the electronic part the number of electronic parts still remaining on the plurality of parts feeders calculated by the remaining parts number calculation unit with the target number of electronic parts to be mounted on the substrate stored in the target parts-to-be-mounted number memory unit and that, when the number of remaining electronic parts of at least one type is smaller than the target number of the electronic parts to be mounted, deactivates the mount head.

In another mode of the invention, an electronic parts mounting method is one that is to be implemented by an electronic parts mounting apparatus that includes a substrate conveyance path for conveying and positioning a substrate on which a plurality of types of electronic parts are to be mounted; a plurality of parts feeders that feed, according to the type, the plurality of types of electronic parts to be mounted on the substrate; a mount head that picks up the plurality of types of electronic parts fed from the respective parts feeders and mounts the thus-picked-up electronic parts to the substrate positioned by the substrate conveyance path; a remaining parts number calculation unit that calculates number of electronic parts still remaining on the plurality of parts feeders according to the type of the electronic part; and a target parts-to-be-mounted number memory unit that stores target number of electronic parts to be mounted on the substrate according to the type of the electronic part, the method comprising:

comparing according to the type of the electronic part, before the mount head starts mounting the electronic parts on the substrate positioned by the substrate conveyance paths, number of electronic parts still remaining on the plurality of parts feeders calculated by the remaining parts number calculation unit with target number of electronic parts to be mounted on the substrate stored in the target parts-to-be-mounted number memory unit; and deactivating the mount head when number of remaining electronic parts of at least one type is determined to be smaller than the target number of electronic parts to be mounted as a result of the comparison of the number of electronic parts still remaining on the plurality of parts feeders calculated by the remaining parts number calculation unit with the target number of electronic parts to be mounted on the substrate stored in the target parts-to-be-mounted number memory unit according to the type of the electronic part.

Advantage of the Invention

According to the invention, before the mount head starts mounting the electronic parts on the substrates, the number of electronic parts still remaining on the plurality of parts feeders is compared with the target number of electronic parts to be mounted on the substrates according to the type of the electronic part. When the number of remaining electronic parts of at least one type becomes smaller than the target number of electronic parts to be mounted, the mount head is deactivated. Accordingly, replacement of the tape and changing of the substrate that is to be a target of mounting of the electronic parts are performed on this occasion. Thus, a variety of types of electronic parts having equivalent electric characteristics can be mounted on a single substrate, so that defective quality of the entire substrate, which would otherwise occur as a result of mixed mounting of the electronic parts having different electric characteristics, can be prevented.

EMBODIMENT FOR IMPLEMENTING THE INVENTION

Figure 1:
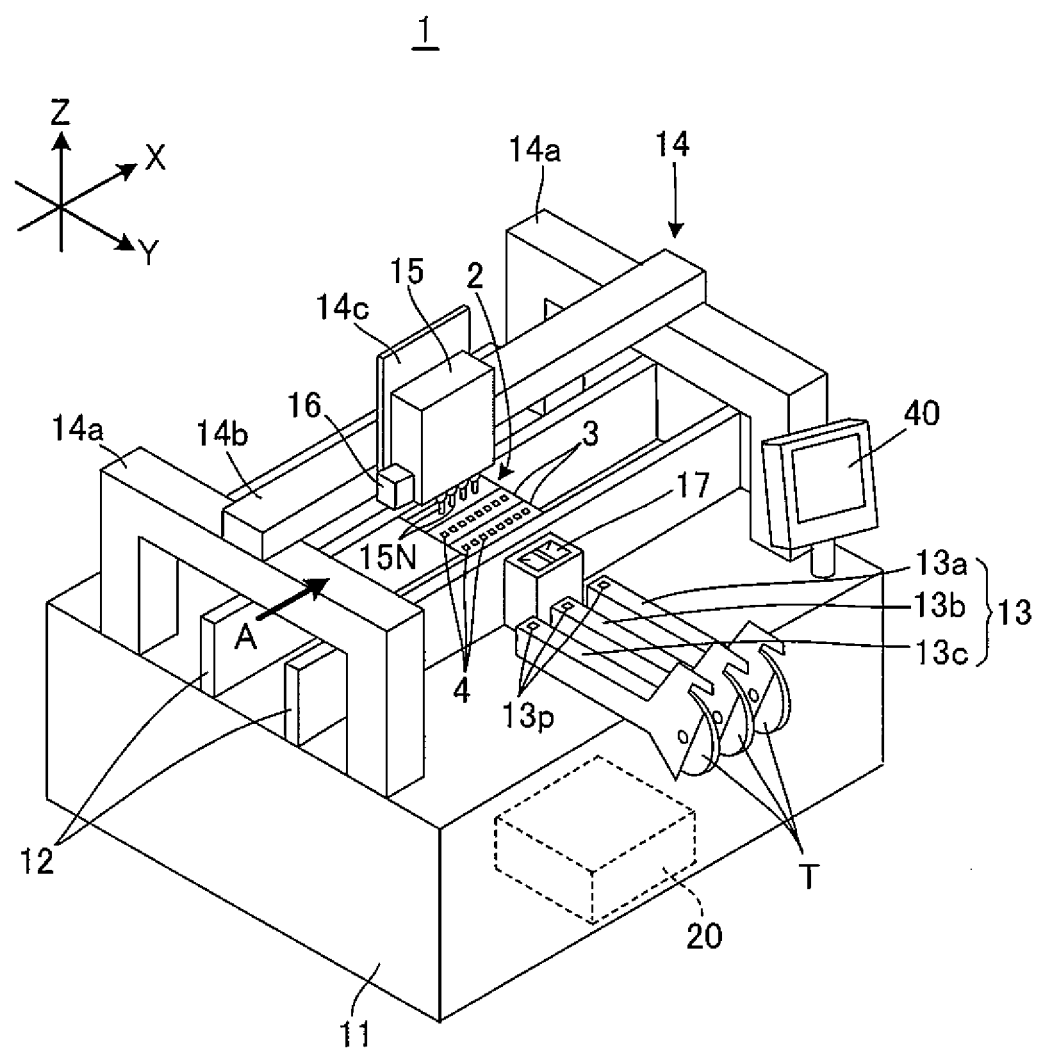
FIG. 1 is a perspective view of an electronic parts mounting apparatus of an embodiment of the invention.

An embodiment of the invention is hereunder described by reference to the drawings. In FIG. 1, an electronic parts mounting apparatus 1 is one that mounts LED parts 4, or electronic parts, onto each of plural unit substrates (hereinafter referred to simply as a "substrate") 3 for use in manufacturing a lighting substrate, which is held on a multiple substrate 2 brought from another un-illustrated upstream-located apparatus and, in addition, conveys the multiple substrate 2 to an un-illustrated downstream-located apparatus. When linked to other pieces of un-illustrated apparatus, such as a screen printer, an inspection machine, and a reflow furnace, the electronic parts mounting apparatus 1 makes up a parts mounting line for production of mounted substrates. For convenience of explanation, a direction of the electronic parts mounting apparatus 1 in which the multiple substrate 2 is to be conveyed (a direction in FIG. 1 in which arrow A is directed) is hereunder taken as an X-axis direction; and a horizontal in-plane direction that is orthogonal to the X-axis direction is taken as a Y-axis direction; a vertical direction is taken as a Z-axis direction; and the Y-axis direction is taken as a front-to-back direction of the electronic parts mounting apparatus 1.

In FIG. 1, the electronic parts mounting apparatus 1 is equipped with substrate conveyance paths 12 that are laid on a bench 11 and that convey the multiple substrate 2 (in consequence, each of the substrates 3) in the direction of a horizontal in-plane direction (the X-axis direction) and positions the thus-conveyed multiple substrate 2; tape feeders (three tape feeders in the embodiment) 13 (parts feeders) that are disposed, along the X-axis direction, side by side on one surface of the bench 11 in its Y-axis direction and that feed the LED parts 4 to be mounted on the respective substrates 3; and a mount head 15 that is made movable by a heat moving mechanism 14 placed on the bench 11 and that picks up the LED parts 4 fed by the respective tape feeders 13 and mounts the thus-picked-up LED parts 4 on the respective substrates 3 held by the multiple substrate 2 on the substrate conveyance paths 12. The tape feeders 13 are a mere example of the parts feeders. In the embodiment, the tape feeders 13 are made up of a first tape feeder 13a, a second tape feeder 13b, and a third tape feeder 13c.

In FIG. 1, the substrate conveyance paths 12 include a pair of belt conveyors. The substrate conveyance paths 12 carry (inside) the multiple substrate 2 delivered from another upstream-located apparatus (e.g., a screen printer) and position at a work position (a position shown in FIG. 1) in a center of the bench 11 and also carry (outside) the multiple substrate 2 on which the LED parts 4 have been mounted by means of the mount head 15, thus delivering the multiple substrate 2 to another downstream-located apparatus (e.g., an inspection machine).

In FIG. 1, each of the tape feeders 13 is removably equipped with a tape T that stores, inline and one by one, the plurality of LED parts 4 having equivalent electrical characteristics, and pitch-feeds the tape T in a given direction (the Y-axis direction oriented toward the substrate conveyance paths 12), thereby continuously feeding the LED parts 4 one by one to a parts pick-out port 13p opened at an end of the individual tape feeder 13 which is located around the center of the bench 11 (i.e., around the substrate conveyance path 12).

Of the three tape feeders 13, the first tape feeder 13a feeds; for instance, red LEDs, as the LED parts 4. The second tape feeder 13b feeds; for instance, blue LEDs, as the LED parts 4. The third tape feeder 13c feeds; for instance, yellow LEDs, as the LED parts 4. Specifically, in the embodiment, the plurality of tape feeders 13 are to feed the plurality of types of LED parts 4 to be mounted on the substrates 3 according to the type of the individual LED part 4.

In FIG. 1, the head moving mechanism 14 is made up of a pair of gantry frames 14a that are provided so as to extend in the Y-axis direction and straddle the substrate conveyance paths 12; a beam-shaped X-axis table 14b that is provided so as to extend in the X-axis direction, whose both ends are supported by the pair of gantry frames 14a, and that is provided so as to be movable in the Y-axis direction; and a plate-shaped moving stage 14c that is provided so as to be movable in the X-axis direction and over the X-axis table 14b. Attached to the moving stage 14c is the foregoing mount head 15 having a plurality of downwardly-extended suction nozzles 15N which are vertically movable and turnable around the vertical axis (the Z axis).

In FIG. 1, the mount head 15 is equipped with a substrate camera 16 whose imaging field of view is downwardly oriented. Further, a parts camera 17 whose imaging field of view is upwardly oriented is positioned in an area on the bench 11 between the substrate conveyance paths 12 and the tape feeders 13.

Figure 2:
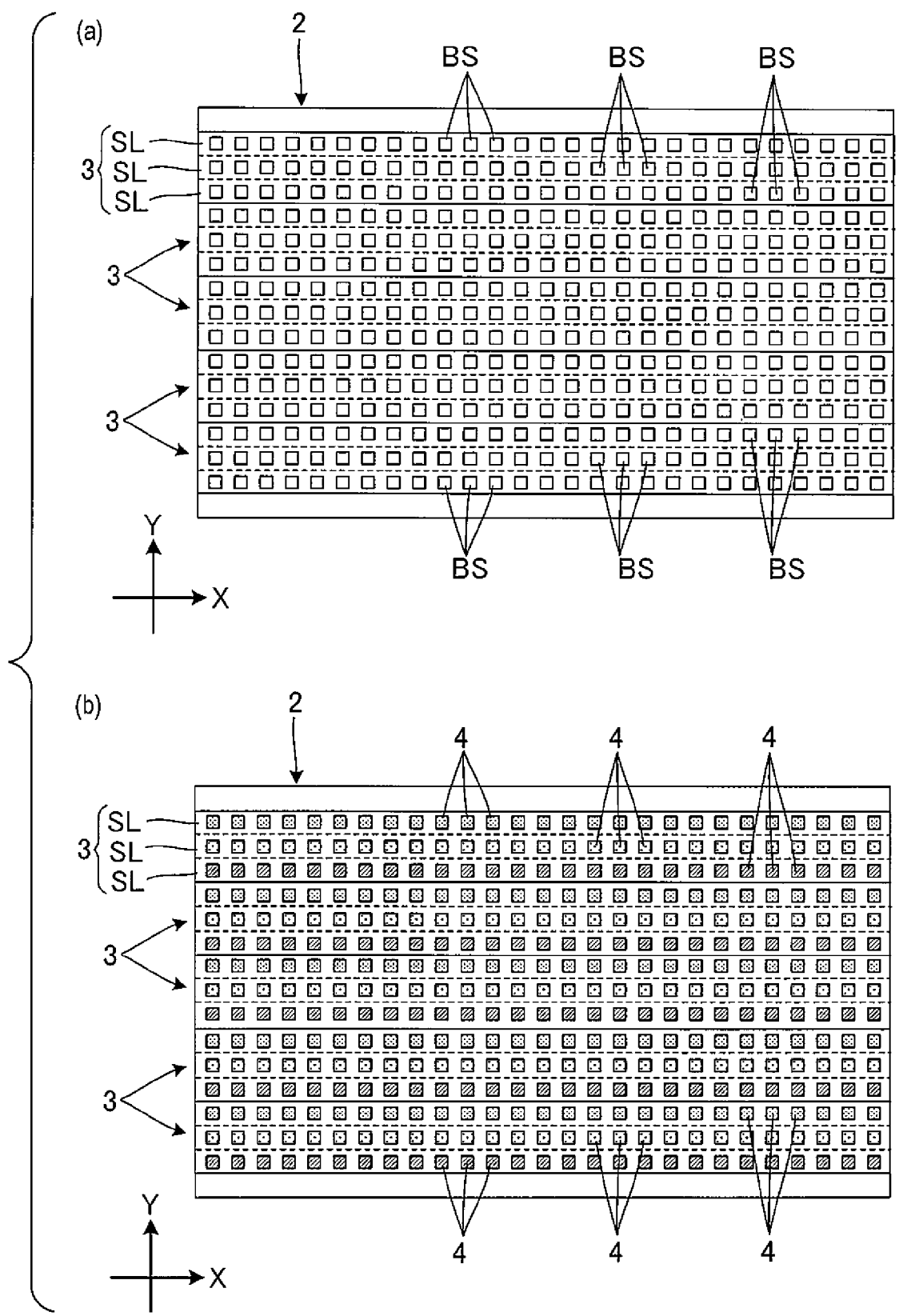
FIGS. 2 (a) and (b) are plan views of a multiple substrate including a plurality of unit substrates on which LED parts are mounted by the electronic parts mounting apparatus of the embodiment of the invention.

In FIGS. 2(a) and (b), each of the substrates 3 has an elongated shape that is extended in the direction (the X-axis direction) of conveyance of the multiple substrate 2 along which the substrate conveyance paths 12 convey the multiple substrate 2. The substrate 3 is arranged in numbers (five in the embodiment) on the multiple substrate 2 along its widthwise direction (the Y-axis direction) and held on the multiple substrate 2.

In FIG. 2(a), three rows of color-specific LED parts mount fields SL in which the LED parts 4 of the same type (the same color) are arranged inline in the direction of conveyance of the multiple substrate 2 (the X-axis direction) are laid on the individual substrate 3 and side by side in the widthwise direction (the Y-axis direction) of the multiple substrate 2. Further, a plurality of LED parts mount regions BS where the red, blue, and yellow LED parts 4 are to be mounted are provided side by side along the X-axis direction in each of the three rows of the color-specific LED parts mount fields SL. FIG. 2(a) shows the multiple substrate 2 before the LED parts 4 are mounted to the LED parts mount regions BS on the individual substrate 3, and FIG. 2(b) shows the multiple substrate 2 after the LED parts 4 are mounted on the LED parts mount regions BS on the individual substrate 3. In FIG. 2(b), different types of the LED parts 4 are given different patterns, respectively.

Operation for conveying and positioning each of the substrates 3 (the multiple substrate 2 in reality) to be performed by the substrate conveyance paths 12 is implemented by means of a work performance control section 20a (FIG. 3) of a controller 20 (FIGS. 1 and 3) in the electronic parts mounting apparatus 1 controlling operation of a substrate conveyance path actuating section 21 (FIG. 3) made up of an un-illustrated actuator or the like. Also, operation for feeding the LED part 4 to the parts pick-out port 13p to be performed by the individual tape feeder 13 (i.e., operation for pitch-feeding the tape T) is implemented by means of the work performance control section 20a of the controller 20 controlling operation of a tape feeder actuating section 22 (FIG. 3) made up of an un-illustrated actuator or the like.

Operation for conveying the mount head 15 in the horizontal in-plane direction to be performed by the heat moving mechanism 14 is implemented by means of the work performance control section 20a of the controller 20 controlling operation of a heat moving mechanism actuating section 23 (FIG. 3) made up of an un-illustrated actuator or the like (controlling movement of the X-axis table 14b in the Y-axis direction with respect to the pair of gantry frames 14a and movement of the moving stage 14c in the X-axis direction with respect to the X-axis table 14b). Operation for vertically moving the respective suction nozzles 15N with respect to the mount head 15 and turning the suction nozzles 15 N around the vertical axis is implemented by means of the work performance control section 20a of the controller 20 controlling operation of a nozzle actuating section 24 (FIG. 3) made up of an un-illustrated actuator or the like.

Operation for sucking or releasing the LED part 4 to be performed by the individual suction nozzle 15N is implemented by means of the work performance control section 20a of the controller 20 controlling operation of a vacuum feeding section 25 (FIG. 3) made up of an un-illustrated actuator or the like, to thereby feed a vacuum into the suction nozzle 15N or discontinue a feed of the vacuum into the suction nozzle 15N.

Figure 3:
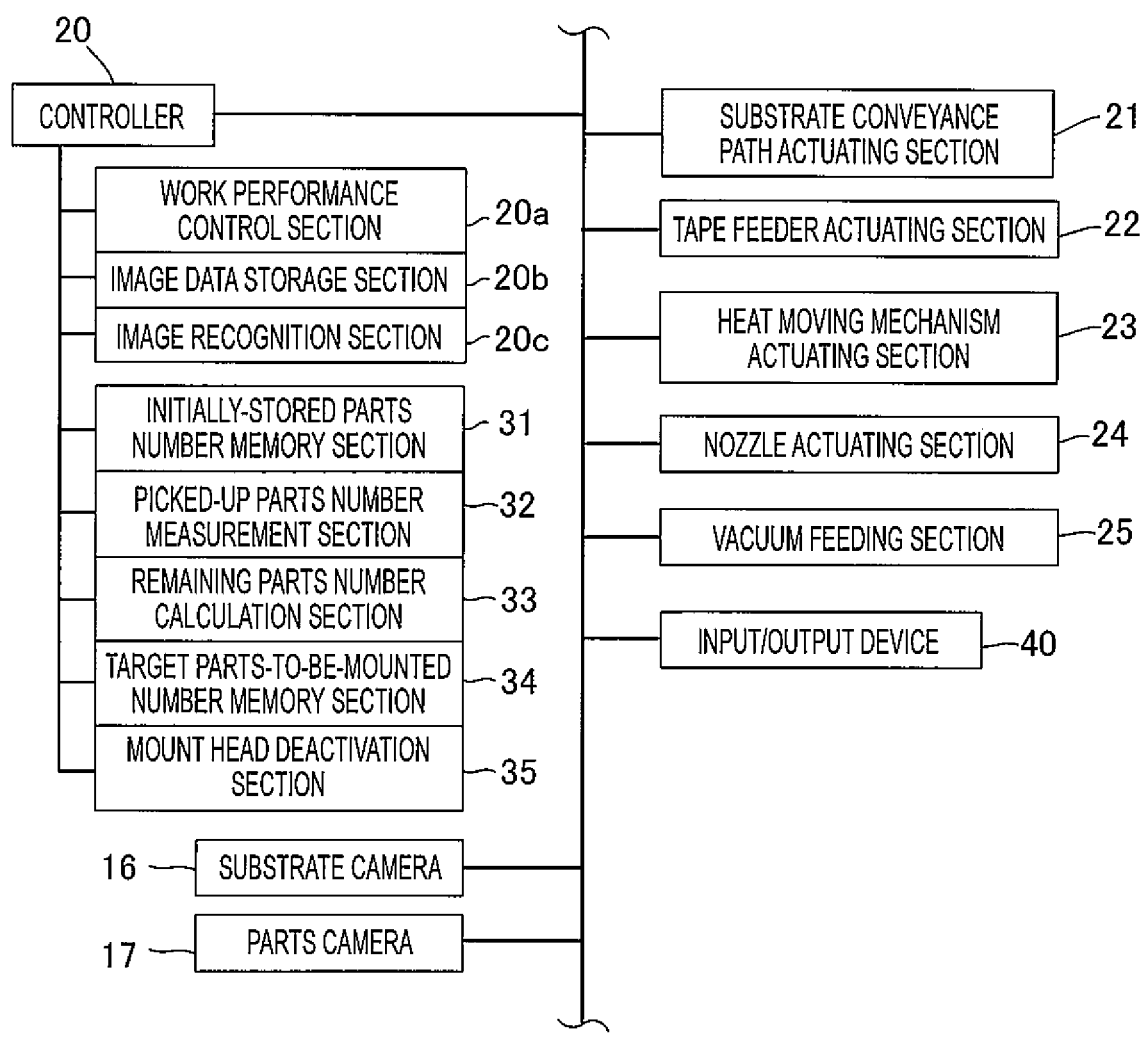
FIG. 3 is a block diagram showing a control system of the electronic parts mounting apparatus of the embodiment of the invention.

Imaging operation to be performed by the substrate camera 16 and the parts camera 17 is implemented by means of the work performance control section 20a of the controller 20 controlling operation of the substrate camera 16 and the parts camera 17 (FIG. 3). Data pertaining to images captured by imaging operation of the substrate camera 16 and the parts camera 17 are stored in an image data storage section 20b (FIG. 3) and subjected to image recognition performed by an image recognition section 20c (FIG. 3) in the controller 20.

In FIG. 3, the controller 20 has an initially-stored parts number memory section 31, a picked-up parts number measurement section 32, a remaining parts number calculation section 33, a target parts-to-be-mounted number memory section 34, and a mount head deactivation section 35.

The initially-stored parts number memory section 31 retains the number of LED parts 4 (an initially-stored parts number N1) that is initially stored in a tape T loaded on the individual tape feeder 13. Specifically, the initially-stored parts number memory section 31 stores the number of red LEDs initially stored in the tape T attached to the first tape feeder 13a, the number of blue LEDs initially stored in the tape T loaded on the second tape feeder 13b, and the number of yellow LEDs initially stored in the tape T loaded on the third tape feeder 13c. Incidentally, an operator (not shown) inputs, by way of an input/output device 40 (FIGS. 1 and 3), the number (N1) of parts initially stored in the tape T loaded on each of the tape feeders 13.

The picked-up parts number measurement section 32 measures the number (a pickup number N2) of LED parts 4 picked up by the mount head 15 from the individual tape T on the basis of the number of times the tape T of each of the tape feeders 13 is fed. Specifically, the picked-up parts number measurement section 32 measures the number of red LEDs picked up from the tape T of the first tape feeder 13a, the number of blue LEDs picked up from the tape T of the second tape feeder 13b, and the number of yellow LEDs picked up from the tape T of the third tape feeder 13c.

The remaining parts number calculation section 33 calculates the number (N) of LED parts 4 still remaining in the plurality of tape feeders 13 according to the type of the LED part 4 by means of subtracting the number (N2) of parts picked up from the tapes T measured by the picked-up parts number measurement section 32 from the number (N1) of parts initially stored in the tape T of each of the tape feeders 13 stored in the initially-stored parts number memory section 31. Specifically, the remaining parts number calculation section 33 calculates the number of red LEDs still remaining in the tape T of the first tape feeder 13a, the number of blue LEDs still remaining in the tape T of the second tape feeder 13b, and the number of yellow LEDs still remaining in the tape T of the third tape feeder 13c.

The target parts-to-be-mounted number memory section 34 stores a target number (N0) of LED parts 4 to be mounted on the individual substrate 3 with the mount head 15 according to the type of the LED part 4. Specifically, the target parts-to-be-mounted number memory section 34 stores the target number of red LEDs to be mounted on the substrate 3, the target number of blue LEDs to be mounted on the substrate 3, and the target number of yellow LEDs to be mounted on the substrate 3. The target number (N0) of LED parts 4 to be mounted on the substrate 3 also corresponds to the number of LED parts mount regions BS in each of the color-specific LED parts mount fields SL on the individual substrate 3.

Before commencement of operation for mounting the LED parts 4 with the mount head 5 onto the individual substrate 3, which is positioned by means of the substrate conveyance paths 12, the mount head deactivation section 35 compares the number (N) of the LED parts 4 still remaining on the three tape feeders 13 calculated by the remaining parts number calculation section 33 with the target number (N0) of LED parts 4 to be mounted on the substrate 3 stored in the target parts-to-be-mounted number memory section 34 according to the type (color) of the LED part 4. As a result, in relation to at least one type of LED parts 4, when the number (N) of remaining LED parts 4 is smaller than the target number (N0) of LED parts 4 to be mounted, the mount head 15 is deactivated to thus inhibit the mount head 15 from picking up the LED parts 4 from any of the three tape feeders; namely, the first tape feeder 13a, the second tape feeder 13b, and the third tape feeder 13c (therefore preventing mounting of the LED parts 4 on the substrate 3).

For instance, provided that the target number of red LEDs to be mounted on the substrate 3 is 20; that the number of red LEDs still remaining in the tape T of the first tape feeder 13a, which has been calculated before initiation of operation for mounting the LED parts 4 to the substrate 3, is 10; and that the number of still remaining red LEDs is smaller than the target number of red LEDs to be mounted, the mount head deactivation section 35 deactivates the mount head 15 even when, for instance, the number of blue LEDs still remaining on the tape T of the second tape feeder 13b is larger than the target number of blue LEDs to be mounted and when the number of yellow LEDs still remaining on the tape T of the third tape feeder 13c is larger than the target number of yellow LEDs to be mounted.

Procedures of a parts mounting process to be performed by the electronic parts mounting apparatus 1 of the embodiment are now described. The work performance control section 20a of the controller 20 in the electronic parts mounting apparatus 1 first controls operation of the substrate conveyance path actuating section 21, thereby carrying (inside) the multiple substrate 2 delivered from another upstream-located apparatus (e.g., the screen printer) by means of the substrate conveyance paths 12 and positioning the substrate 2 at a predetermined work position (a multiple substrate carrying-in-and-positioning process of step ST1 shown in FIG. 4).

After positioning the multiple substrate 2 at a predetermined work position, the work performance control section 20a of the controller 20 moves the substrate camera 16 (or the mount head 15) to an elevated position above the multiple substrate 2 and lets the camera capture an image of a substrate mark (not shown) put on the multiple substrate 2. The work performance control section 20a also causes the image recognition section 20c to recognize the thus-acquired image, thereby determining positional displacement from a normal work position of the multiple substrate 2.

Figure 4:
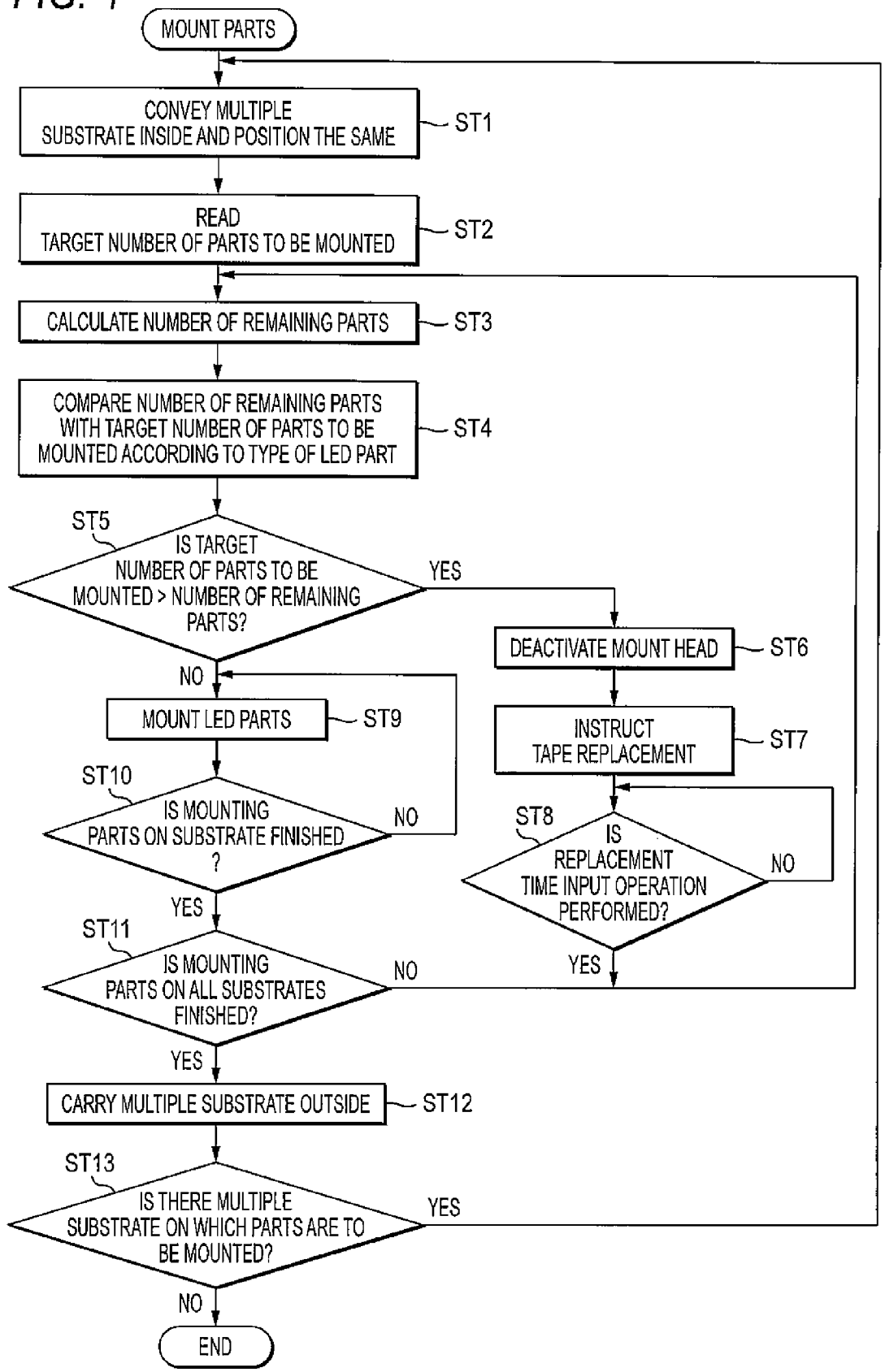
FIG. 4 is a flowchart showing processing pertaining to procedures of parts mounting processes that the electronic parts mounting apparatus of the embodiment of the invention performs.

After having completed processing pertaining to the multiple substrate carrying-in-and-positioning process of step ST1, the work performance control section 20a of the controller 20 reads the target number (N0) of LED parts 4 to be mounted on the substrate 3 stored in the target parts-to-be-mounted number memory section 34 according to the type of the LED part 4 (a "target-number-of-parts-to-be-mounted read" process of step ST2 shown in FIG. 4). The remaining parts number calculation section 33 calculates the number (N) of parts still remaining in the individual tape feeder 13 (a "remaining parts number calculation" process of step ST3 shown in FIG. 4) and compares the thus-calculated number (N) of parts still remaining in the individual tape feeder 13 with the target number (N0) of parts to be mounted read in step ST2 according to the type of the LED part 4 (a "comparison" process of step ST4 shown in FIG. 4).

From the comparison result, the work performance control section 20a of the controller 20 determines whether or not the number (N) of remaining LED parts 4 of at least one type is smaller than the target number (N0) of LED parts 4 of the same type to be mounted; in other words, whether or not there are LED parts 4 that are deficient in number (a "determination" process of step ST5 shown in FIG. 4). When the result shows that the number (N) of remaining LED parts 4 of at least one type is smaller than the target number (N0) of LED parts 4 of the same type to be mounted (YES); in other words, when there are LED parts 4 that are deficient in number, the work performance control section 20a of the controller 20 causes the mount head deactivation section 35 to deactivate the mount head 15 (a "mount head deactivation" process of step ST6 shown in FIG. 4); outputs a message to an input/output device 40; and gives an operator an instruction for replacing the tape T assigned to the LED parts 4 that are deficient in number (a "tape replacement instruction" process of step ST7 shown in FIG. 4).

The operator who saw the message on the input/output device 40 in the "tape replacement instruction" process of step ST7 replaces the tape T assigned to the LED parts 4 that are deficient in number and shown in the input/output device 40 and performs, by way of the input/output device 40, operation to the effect that the tape T has been replaced and operation (replacement time input operation) for inputting the number of LED parts 4 stored in a new tape T (the initially-stored parts number N1).

After outputting the message, the work performance control section 20a of the controller 20 waits for detecting that the operator has performed replacement time input operation from a signal output from the input/output device 40 (a "wait for detecting replacement time input operation" process of step ST8 shown in FIG. 4). When detecting that the operator has performed replacement time input operation (YES), the work performance control section 20a returns operation to step ST3, where processing pertaining to the "remaining parts number calculation" process is performed anew. Incidentally, when failing to detect that the operator has performed the replacement time input operation (NO), the work performance control section 20a iterates processing pertaining to step ST8.

In the meantime, in step ST5, when the number (N) of remaining LED parts 4 is larger than the target number (N0) of LED parts 4 in connection with all types of LED parts 4 to be mounted (NO); in other words, when there are no LED parts 4 that are deficient in number, the work performance control section 20a of the controller 20 mounts the LED parts 4 on the substrates 3 (an "LED parts mounting" process of step ST9 shown in FIG. 4).

The "LED parts mounting" process of step ST9 includes a "pickup step," an "image recognition step," and a "mounting step" to be provided below. In the "LED parts mounting" process of step ST9, the work performance control section 20a of the controller 20 first moves the mount head 15 to an elevated position above the tape feeders 13 and controls operation of the nozzle actuating section 24, thereby bringing the suction nozzles 15N of the mount head 15 into contact with the LED parts 4 fed to the parts pick-out ports 13p of the respective tape feeders 13. In addition, the work performance control section 20a of the controller 20 controls operation of the vacuum feeding section 25, thereby feeding a vacuum to each of the suction nozzles 15N, whereby the suction nozzles 15N pick up (suck) the LED parts 4 (the pickup step).

In the "LED parts mounting" process of step ST9, the work performance control section 20a of the controller 20 also moves, after picking up the LED parts 4 with the suction nozzles 15N, the mount head 15 such that the thus-picked-up LED parts 4 pass above the parts camera 17, whereupon the parts camera 17 captures images of the LED parts 4. The image recognition section 20c recognizes the thus-captured images through image recognition, inspecting whether or not the LED part 4 has an anomaly (deformation, chipping, or the like) and also determining positional displacement (suction displacement) of the LED part 4 with respect to the corresponding suction nozzle 15N (the image recognition step).

Moreover, in the "LED parts mounting" process of step ST9, the work performance control section 20a of the controller 20 moves, after image recognition of the LED parts 4 picked up by the mount head 15, the mount head 15 to an elevated position above the substrate 3 on which the LED parts 4 are to be mounted; brings the picked-up LED parts 4 into contact with the LED parts mount regions BS (the LED parts mount regions BS are previously printed with solder by the screen printer disposed at an upstream side in the electronic parts mounting apparatus 1) on the substrate 3; controls operation of the vacuum feeding section 25 to thereby terminate a supply of the vacuum to the suction nozzles 15N and mount the LED parts 4 to the respective LED parts mount regions BS on the substrate 3 (the mounting step).

When mounting the LED parts 4 to the respective LED parts mount regions BS on the substrate 3, the work performance control section 20a of the controller 20 makes corrections (including rotational corrections) to the positions of the respective suction nozzles 15N with respect to the multiple substrate 2 (in other words, with respect to the substrate 3) such that the positional displacement of the multiple substrate 2 determined during positioning of the multiple substrate 2 in step ST1 and the suction displacement of the LED parts 4 determined during image recognition of the LED parts 4 are corrected.

After mounting one LED part 4 on the substrate 3 (the LED parts mount region BS), the work performance control section 20a of the controller 20 controls operation of the tape feeder actuating section 22; subsequently pitch-feeds the tape T that feeds the LED parts 4 to the parts pick-out port 13p; and determines whether or not all of the LED parts 4 to be mounted have finished being mounted on the substrate 3 that is now in the process of undergoing mount of the LED parts 4 (a "parts mount completion determination" process of step ST10 shown in FIG. 4). As a consequence, when all of the LED parts 4 to be mounted have not yet finished being mounted on the substrate 3 that is now in the process of undergoing mount of the LED parts 4 (NO), the work performance control section 20a of the controller 20 repeatedly performs processing pertaining to the "LED parts mounting" process of step ST9. In contrast, when all of the LED parts 4 to be mounted have finished being mounted on the substrate 3 that is now in the process of undergoing mounting the LED parts 4 (YES), the work performance control section 20a of the controller 20 determines whether or not the LED parts 4 have finished being mounted on all the substrates 3 on the multiple substrate 2 that is now in the process of undergoing mounting of the LED parts 4 (a "determination-as-to-whether-all-substrate-parts-are-mounted" process of step ST11 shown in FIG. 4).

When in step ST11 the LED parts 4 to be mounted have not yet finished being mounted on all the substrates 3 of the multiple substrate 2 that is now in the process of undergoing mount of the LED parts 4 (NO), the work performance control section 20a of the controller 20 returns to step ST3, where the work performance control section 20a subjects the substrate 3 on which the LED parts 4 are not yet mounted to processing pertaining to the LED parts mounting process. In the meantime, when in step ST11 the LED parts 4 to be mounted have finished being mounted on all the substrate 3 of the multiple substrate 2 that is now in the process of undergoing mounting the LED parts 4 (YES), the work performance control section 20a activates the substrate conveyance paths 12, thereby conveying the multiple substrate 2, which is now positioned by the substrate conveyance paths 12, to the outside of the electronic parts mounting apparatus 1 (a "multiple substrate carrying-out" process of step ST12 shown in FIG. 4).

After completion of processing pertaining to the multiple substrate carrying-out process of step ST12, the work performance control section 20a of the controller 20 determines whether or not the multiple substrate 2 on which the LED parts 4 are to be mounted still exists (a "substrate presence/absence determination" process of step ST13 shown in FIG. 4). As a consequence, when there still exists the multiple substrate 2 on which the LED parts 4 are to be mounted (YES), the work performance control section 20a of the controller 20 returns to step ST1, where a new multiple substrate 2 is conveyed inside. In contrast to this, when there is not any multiple substrate 2 on which the LED parts 4 are to be mounted (NO), a series of parts mounting processes ends.

As mentioned above, the electronic parts mounting apparatus 1 of the embodiment includes the substrate conveyance paths 12 for conveying and positioning the substrate 3 on which the plurality of types (colors) of the LED parts 4 are to be mounted; the plurality of tape feeders 13 that feed according to the type (color) the plurality of types of LED parts 4 to be mounted on the substrate 3; the mount head 15 that picks up the plurality of types of LED parts 4 fed from the respective tape feeders 13 and mounts the thus-picked-up LED parts 4 to the substrate 3 positioned by the substrate conveyance paths 12; the remaining parts number calculation section 33 that serves as remaining parts number calculation means for calculating the number (N) of LED parts 4 still remaining on the plurality of tape feeders 13 according to the type of the LED parts 4; and the target parts-to-be-mounted number memory section 34 that serves as target parts-to-be-mounted number memory means for storing the target number (N0) of LED parts 4 to be mounted on the substrate 3 according to the type of the LED part 4. Additionally provided in the electronic parts mounting apparatus 1 is mount head deactivation means (the mount head deactivation section 35 of the controller 20) that, before the mount head 15 starts mounting the LED parts 4 on the substrate 3 positioned by the substrate conveyance paths 12, compares the number (N) of LED parts 4 still remaining on the plurality of tape feeders 13 calculated by the remaining parts number calculation section 33 with the target number (N0) of LED parts 4 to be mounted on the substrate 3 stored in the target parts-to-be-mounted number memory section 34 according to the type of the LED part 4 and that, when the number (N) of remaining LED parts 4 of at least one type is smaller than the target number (N0) of the LED parts 4 to be mounted, deactivates the mount head 15.

The electronic parts mounting method of the embodiment is the one to be implemented by the electronic parts mounting apparatus 1 of the embodiment. The method includes comparing, before the mount head 15 starts mounting the LED parts 4 on the substrate 3 positioned by the substrate conveyance paths 12 (the "LED parts mounting" process of step ST9), the number (N) of LED parts 4 still remaining on the plurality of tape feeders 13 calculated by the remaining parts number calculation section 33 with the target number (N0) of LED parts 4 to be mounted on the substrate 3 stored in the target parts-to-be-mounted number memory section 34 according to the type of the LED part 4 (a "comparison" process of step ST4); and deactivating the mount head 15 when the number (N) of remaining LED parts 4 of at least one type is determined to be smaller than the target number (N0) of LED parts 4 to be mounted as a result of the comparison of the number (N) of LED parts 4 still remaining on the plurality of tape feeders 13 calculated by the remaining parts number calculation section 33 with the target number (N0) of LED parts 4 to be mounted on the substrate 3 stored in the target parts-to-be-mounted number memory section 34 according to the type of the LED part 4 (a "mount head deactivation" process of step ST6).

According to the electronic parts mounting apparatus 1 and the electronic parts mounting method of the embodiment, the number of LED parts 4 still remaining on the three tape feeders 13 is compared with the target number of LED parts 4 to be mounted on the substrates 3 according to the type of the LED part 4 before the mount head 15 starts mounting the LED parts 4 on the substrates 3. When the number of remaining LED parts 4 of at least one type becomes smaller than the target number of LED parts 4 to be mounted (i.e., when any of the tape feeders 13 lacks in parts), the mount head 15 is deactivated. Replacement of the tape T and changing of the substrate 3 that is to be a target of mounting of the LED parts 4 are performed on this occasion. Thus, various types (colors) of the LED parts 4 having equivalent electric characteristics can be mounted on a single substrate 3, so that defective quality of the entire substrate 3, which would otherwise occur as a result of mixed mounting of the LED parts 4 having different electric characteristics, can be prevented.

After deactivation of the mount head 15, the tape T that has been loaded on the tape feeder 13 thus far is replaced with a new tape T which houses the type of LED parts 4 existing fewer in number (i.e., being deficient in number) than the target number of LED parts to be mounted. The newly-loaded tape T houses the LED parts 4 having equivalent electric characteristics. Consequently, after being deactivated, the mount head 15 mounts the LED parts 4 having equivalent electric characteristics on the substrates 3 to be subjected to processing pertaining to the LED parts mounting process to be performed by the mount head 15, so that production reliability of the substrates 3 can be sustained.

The three primary colors, or Red, Blue, and Yellow, of LEDs to be mounted on a single substrate 3 are required to exhibit consistent cross-color quality as well as equivalent electric characteristics of the respective colors of LEDs. For these reasons, a combination of lots pertaining to three tapes T that feed three colors of LEDs to be mounted on a single substrate 3 is required to be consistent. For instance, it shall be stipulated that lots pertaining to a tape T that feeds red LEDs, another tape T that feeds blue LEDs, and still another tape T that feeds yellow LEDs should correspond to any one of combinations (red LED: Lot A, blue LED: Lot B, and yellow LED: Lot C), (red LED: Lot A', blue LED: Lot B', and yellow LED: Lot C'), .... Therefore, if a combination (Lot A, Lot B, and Lot C) cannot be maintained for shortage of parts in the tape T that houses a certain color of LEDs on occasions when the tape T housing the certain color of LEDs should be replaced while the LED parts 4 are being mounted by means of the combination (Lot A, Lot B, and Lot C), all of the three colors of the tapes T rather than only the tape T housing the certain color of LEDs are replaced, and mounting the parts is continually performed by means of a new combination (Lot A', Lot B', and Lot C').

In contrast with a conventional case where mounting electronic parts is continually performed by replacement of a parts feeder when parts have run out, the electronic parts mounting apparatus 1 of the embodiment guarantees that the substrate 3 on which all of the LED parts 4 to be mounted have finished being mounted is free of a mixture of LED parts 4 having different electrical characteristics. Accordingly, it is not necessary to check whether or not the LED parts 4 having different electric characteristics are mixedly mounted on the substrate 3 on which the LED parts 4 have finished being mounted, and such work can be omitted.

Although the embodiment of the invention has been described thus far, the invention is not limited to the above embodiment. For instance, in the embodiment, the LED parts 4 are of three colors; or red, blue, and yellow. However, the LED parts 4 are not necessarily limited to red, blue, and yellow and can be of other colors. Further, the number of colors is not limited three, so long as a plurality of colors (two colors or more) are employed. In addition, the electronic parts fed by the tape feeders 13 are not necessarily LED parts and can be other electronic parts. Moreover, the parts feeder that feeds electronic parts is not limited to a tape feeder and can also be a bulk feeder, a tray feeder, and the like.

The embodiment describes the configuration in which the mount head 15 is deactivated by advanced detection of occurrence of parts shortage and, subsequently, mounting the LED parts 4 on the substrates 3 is resumed only after replacement of the tape T. However, when the electronic parts mounting apparatus 1 has a plurality of tape feeders 3 that feed the LED parts 4 of the same type, there can also be adopted another configuration in which the mount head 15 picks up the LED parts 4 from another tape feeder 13 that feeds the LED parts 4 of the same type and mounts the thus-picked-up LED parts 4 on the substrate 3 without waiting for replacement of the tape T.

In the embodiment, the substrate (the unit substrate 3) on which electronic parts are to be mounted is the lighting substrate; however, the substrate is not limited to the lighting substrate. Moreover, in the embodiment, the substrate (the unit substrate 3) on which electronic parts are to be mounted is held in numbers on the multiple substrate 2. However, the substrates are not necessarily substrates that are held on a multiple substrate.

Although the invention has been described in detail by reference to the specific embodiment, it is manifest to those skilled in the art that the invention be subjected to various alterations or modifications without departing the spirit and scope of the invention.

The patent application is based on Japanese Patent Application (JP-2010-205120) filed on Sep. 14, 2010, the subject matter of which is incorporated herein by reference in its entirety.

INDUSTRIAL APPLICABILITY

There are provided an electronic parts mounting apparatus and an electronic parts mounting method for making it possible to mount various types of electronic parts having equivalent electric characteristics on a single substrate.

DESCRIPTIONS OF THE REFERENCE NUMERALS AND SYMBOLS

1 ELECTRONIC PARTS MOUNTING APPARATUS
3 UNIT SUBSTRATE (SUBSTRATE)

4 LED PARTS (ELECTRONIC PARTS)
12 SUBSTRATE CONVEYANCE PATHS
13 TAPE FEEDER (PARTS FEEDER)
13a FIRST TAPE FEEDER
13b SECOND TAPE FEEDER
13c THIRD TAPE FEEDER
15 MOUNT HEAD
33 REMAINING PARTS NUMBER CALCULATION SECTION (REMAINING PARTS NUMBER CALCULATION UNIT)
34 TARGET PARTS-TO-BE-MOUNTED NUMBER MEMORY SECTION (TARGET PARTS-TO-BE-MOUNTED NUMBER MEMORY UNIT)
35 MOUNT HEAD DEACTIVATION SECTION (MOUNT HEAD DEACTIVATION UNIT)

The invention claimed is:

1. An electronic parts mounting method under which a plurality of types of electronic parts are mounted on a single substrate according to a defined combination of characteristics of the plurality of types of electronic parts by an electronic parts mounting apparatus that includes a substrate conveyance path for conveying and positioning a substrate on which the plurality of types of electronic parts are to be mounted; a plurality of parts feeders that feed, according to the type, the plurality of types of electronic parts to be mounted on the substrate; a mount head that picks up the plurality of types of electronic parts fed from the respective parts feeders and mounts the thus-picked-up electronic parts to the substrate positioned by the substrate conveyance paths; a remaining parts number calculation unit that calculates a number of electronic parts still remaining on the plurality of parts feeders for each of the plurality of types of the electronic parts; and a target parts-to-be-mounted number memory unit that stores a target number of electronic parts to be mounted on the substrate for each of the plurality of types of the electronic parts, the method comprising:

comparing for each of the plurality of types of the electronic parts, before the mount head starts mounting the electronic parts on the substrate positioned by the substrate conveyance path, the number of electronic parts still remaining on the plurality of parts feeders calculated by the remaining parts number calculation unit with the target number of electronic parts to be mounted on the substrate stored in the target parts-to-be-mounted number memory unit;

determining whether a number of remaining electronic parts still remaining on the plurality of parts feeders calculated by the remaining parts number calculation unit of at least one type is smaller than the target number of electronic parts to be mounted on the substrate stored in the target parts-to-be-mounted number memory unit;

deactivating the mount head when the number of remaining electronic parts of at least one type is determined to be smaller than the target number of electronic parts to be mounted; and replacing all of the plurality of types of electronic parts in all the plurality of parts feeders, when the number of remaining electronic parts of at least one type of the plurality of types of electronic parts of the defined combination is smaller than the target number of electronic parts to be mounted.

* * * * *